(12) United States Patent
Ozawa

(10) Patent No.: US 12,550,700 B2
(45) Date of Patent: Feb. 10, 2026

(54) METHOD OF MANUFACTURING A THREE-DIMENSIONAL STACKED SEMICONDUCTOR MEMORY DEVICE

(71) Applicant: Kioxia Corporation, Tokyo (JP)

(72) Inventor: Ayumu Ozawa, Nagoya (JP)

(73) Assignee: Kioxia Corporation, Tokyo (JP)

( * ) Notice: Subject to any disclaimer, the term of this patent is extended or adjusted under 35 U.S.C. 154(b) by 821 days.

(21) Appl. No.: 17/806,534

(22) Filed: Jun. 13, 2022

(65) Prior Publication Data

US 2023/0187271 A1 Jun. 15, 2023

(30) Foreign Application Priority Data

Dec. 14, 2021 (JP) ................................. 2021-202457

(51) Int. Cl.
| | | |
|---|---|---|
| *H01L 21/768* | (2006.01) | |
| *H01L 23/528* | (2006.01) | |
| *H01L 23/535* | (2006.01) | |

(52) U.S. Cl.
CPC .. *H01L 21/76816* (2013.01); *H01L 21/76895* (2013.01); *H01L 23/5283* (2013.01); *H01L 23/535* (2013.01)

(58) Field of Classification Search
CPC ........... H01L 21/76895; H01L 23/5283; H01L 23/528
USPC ....................................................... 257/774
See application file for complete search history.

(56) References Cited

U.S. PATENT DOCUMENTS

| | | | |
|---|---|---|---|
| 8,680,604 B2 | 3/2014 | Higashi et al. | |
| 11,037,945 B2 | 6/2021 | Huang et al. | |
| 2014/0027838 A1* | 1/2014 | Kido .................... | H10D 84/038 |
| | | | 438/269 |
| 2019/0131170 A1 | 5/2019 | Jiang et al. | |
| 2019/0139755 A1 | 5/2019 | Oh et al. | |
| 2019/0319040 A1 | 10/2019 | Ishii et al. | |
| 2020/0251491 A1* | 8/2020 | Ozawa ................ | H01L 21/0274 |

(Continued)

FOREIGN PATENT DOCUMENTS

| | | |
|---|---|---|
| JP | 2010-192589 A | 9/2010 |
| JP | 2014-27104 A | 2/2014 |
| JP | 2020-126928 A | 8/2020 |

(Continued)

*Primary Examiner* — Eliseo Ramos Feliciano
*Assistant Examiner* — Mikka Liu
(74) *Attorney, Agent, or Firm* — Oblon, McClelland, Maier & Neustadt, L.L.P.

(57) ABSTRACT

A method of manufacturing a semiconductor memory device of one embodiment includes a first resist forming process, a first step forming process, a second resist forming process, and a second step forming process. In the first resist forming process, a first resist layer is formed on the upper surface of the stacked body. In the first step forming process, a lower region of a first stepped portion and an upper region of a second stepped portion are simultaneously formed by etching processing performed via the first opening pattern. In the second resist forming process, a second resist layer having a second opening pattern is formed on the upper surface of the stacked body. In the second step forming process, the upper region of the first stepped portion and the lower region of the second stepped portion are simultaneously formed by etching processing performed via the second opening pattern.

7 Claims, 11 Drawing Sheets

(56) References Cited

U.S. PATENT DOCUMENTS

2020/0286912 A1* 9/2020 Nanami ................ H10B 43/27
2021/0134820 A1   5/2021 Huang et al.

FOREIGN PATENT DOCUMENTS

JP      2020-141094 A    9/2020
TW         I710118 B    11/2020

* cited by examiner

METHOD OF MANUFACTURING A THREE-DIMENSIONAL STACKED SEMICONDUCTOR MEMORY DEVICE

CROSS-REFERENCE TO RELATED APPLICATIONS

This application is based upon and claims the benefit of priority from Japanese Patent Application No. 2021-202457, filed on Dec. 14, 2021; the entire contents of which are incorporated herein by reference.

FIELD

An embodiment described herein relate generally to a method of manufacturing a semiconductor memory device and the semiconductor memory device.

BACKGROUND

A three-dimensional stacked memory is used as a semiconductor memory device. In the three-dimensional stacked memory, a plurality of memory cells are three-dimensionally arranged in a stacked body in which a plurality of conductive layers and insulating layers are alternately stacked. In such a three-dimensional stacked memory, a stacked body may be formed in a stepwise manner in order to increase the arrangement number of contacts for extracting charge from a memory cell. In particular, a descending stepped portion stepped down in a predetermined direction and an ascending stepped portion stepped up in the predetermined direction may be formed so as to face each other. In this case, since a contact cannot be arranged in a gap between the descending stepped portion and the ascending stepped portion, as much reduction of the gap as possible is desired. The gap, however, cannot be sufficiently reduced by a conventional manufacturing method.

DETAILED DESCRIPTION

According to one embodiment, there is provided a method of manufacturing a semiconductor memory device in which a descending stepped portion and an ascending stepped portion are formed in a stacked body. A plurality of unit layers each including a set of a conductive layer and an insulating layer is stacked in the stacked body. In the descending stepped portion, the unit layers are stepped down in a first direction. In the ascending stepped portion, the unit layers are stepped up in the first direction so as to face the descending stepped portion. The manufacturing method includes a first resist forming process, a first step forming process, a second resist forming process, and a second step forming process. In the first resist forming process, a first resist layer is formed on the upper surface of the stacked body. In the first resist layer, a first opening pattern that exposes a part of the upper surface of the stacked body is formed. In the first step forming process, a lower region of a first stepped portion and an upper region of a second stepped portion are simultaneously formed by etching processing performed via the first opening pattern. The lower region of the first stepped portion is one of the descending stepped portion and the ascending stepped portion. The upper region of the second stepped portion is the other of the descending stepped portion and the ascending stepped portion. In the second resist forming process, a second resist layer having a second opening pattern is formed on the upper surface of the stacked body. The second opening pattern exposes a part of an intermediate bottom portion and the lower region of the first stepped portion. The intermediate bottom portion is the lowermost step of the first stepped portion and the second stepped portion formed by the first step forming process. In the second step forming process, the upper region of the first stepped portion and the lower region of the second stepped portion are simultaneously formed by etching processing performed via the second opening pattern.

A semiconductor memory device according to the embodiment and a method of manufacturing the semiconductor memory device will be described in detail below with reference to the accompanying drawings. Note that the present invention is not limited by the embodiment. Furthermore, cross-sectional views and the like of the semiconductor memory device used in the following embodiment are schematic, and the relation between the thickness and the width of a layer, the ratio between the thicknesses of layers, and the like may be different from actual relation, ratio, and the like.

Figure 1:
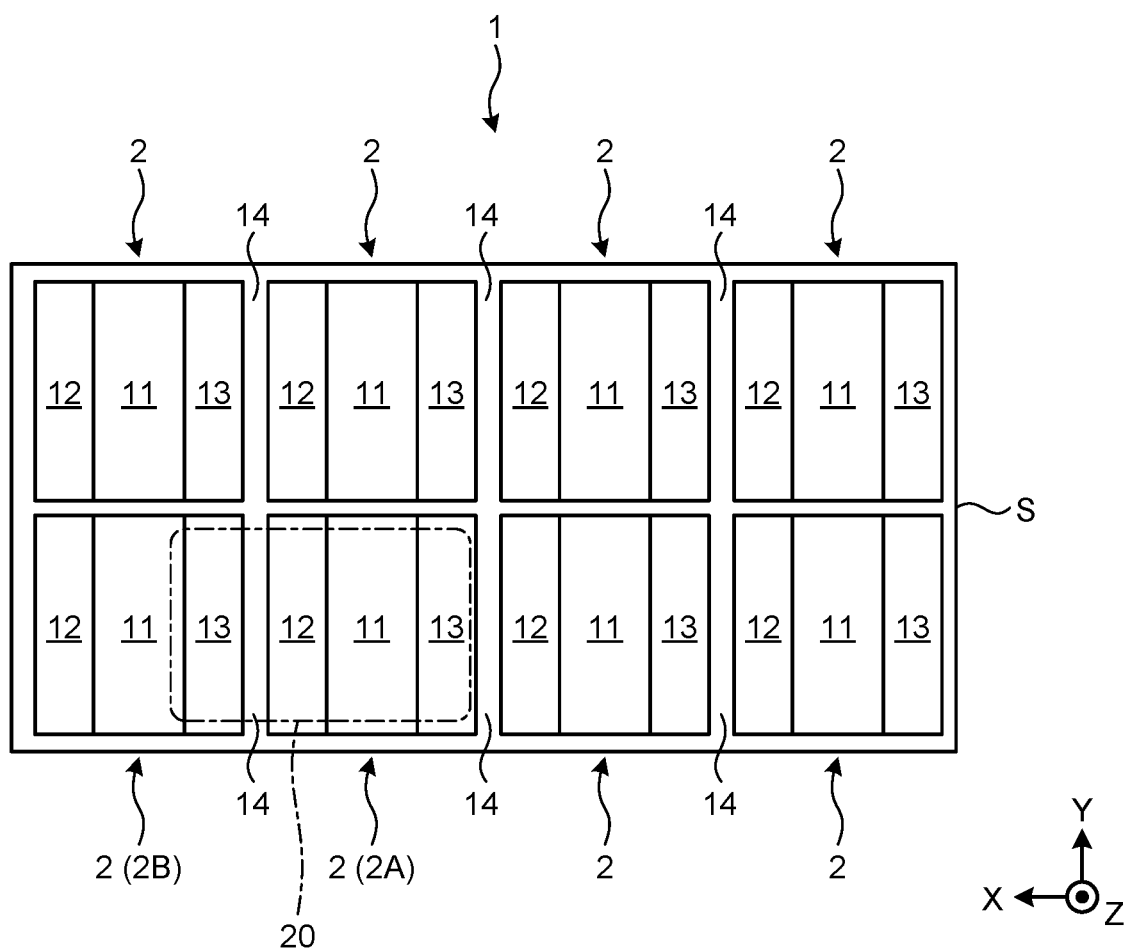
FIG. 1 is a top view illustrating one example of the overall configuration of a semiconductor memory device according to an embodiment.

FIG. 1 is a top view illustrating one example of the overall configuration of a semiconductor memory device 1 according to the embodiment. In FIG. 1, an X direction (one example of first direction) corresponds to a direction from right to left on a paper surface. A Y direction corresponds to a direction from bottom to top on the paper surface. A Z direction corresponds to a direction from back to front on the paper surface. The X direction, the Y direction, and the Z direction in the other drawings correspond to the X direction, the Y direction, and the Z direction in FIG. 1, respectively.

As illustrated in FIG. 1, a semiconductor memory device 1 of the embodiment includes a plurality of (eight in embodiment) cells 2 is arranged on a substrate S. Each of the plurality of cells 2 includes a memory cell array 11, a descending stepped portion 12, and an ascending stepped portion 13.

The memory cell array 11 is a portion in which a plurality of memory cells is three-dimensionally arranged inside a stacked body. In the stacked body, a plurality of unit layers each including a set of a conductive layer and an insulating layer is stacked in the Z direction.

A plurality of contacts capable of outputting charge of each memory cell to the outside is arranged in the descending stepped portion 12 and the ascending stepped portion 13. In the descending stepped portion 12, a plurality of unit layers of the stacked body is stepped down in the X direction. In the ascending stepped portion 13, a plurality of unit layers of the stacked body is stepped up in the X direction.

A gap 14 made of an insulating layer is formed between two adjacent cells 2, and the two adjacent cells 2 are electrically separated. Thus, each cell 2 constitutes an independent storage area. That is, the semiconductor memory device 1 of the embodiment has eight independent storage areas on one substrate S.

Figure 2:
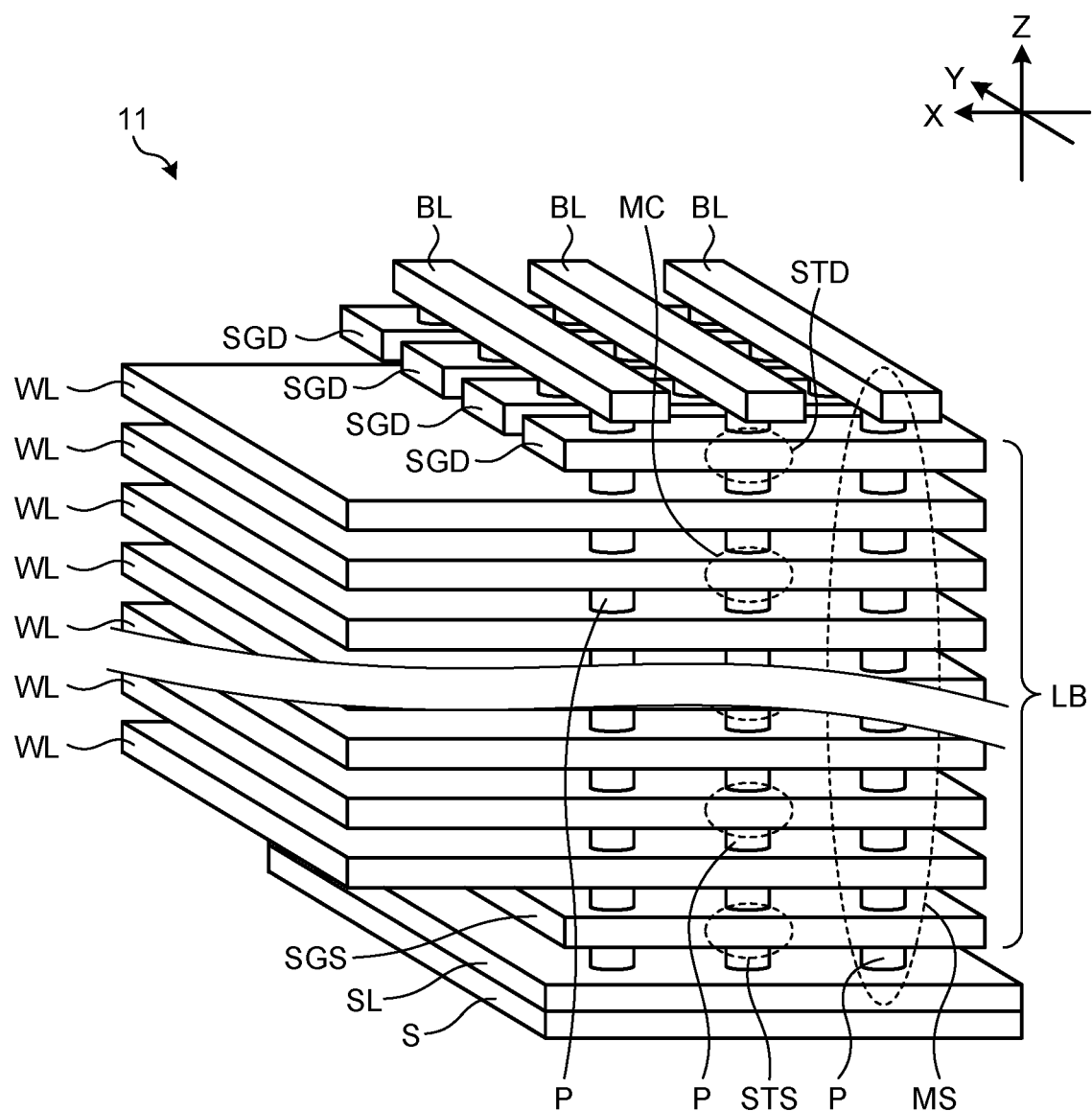
FIG. 2 is a perspective view illustrating one example of the structure of a memory cell array according to the embodiment.

FIG. 2 is a perspective view illustrating one example of the structure of the memory cell array 11 according to the embodiment. In FIG. 2, an insulating layer constituting a part of a stacked body LB is omitted.

A source line SL made of a conductive layer is provided on the substrate S. A plurality of pillars P made of silicon oxide and the like extending along the Z direction is provided on the source line SL. Each pillar P includes a channel layer and a memory layer on the side surface of the pillar P itself. The channel layer includes polysilicon and the like. A plurality of insulating layers is stacked in the memory layer. In the insulating layer provided on the side surface of the pillar P, for example, a tunnel insulating film, a charge storage film, and a block insulating film are stacked from the side of the channel layer. Furthermore, the stacked body LB is provided on the source line SL. In the stacked body LB, a plurality of unit layers is alternately stacked via interlayer insulating layers. Each of the unit layers includes a set of a conductive layer and an insulating layer. The conductive layer includes, for example, tungsten. The insulating layer includes, for example, silicon oxide. Each pillar P penetrates the stacked body LB.

In the stacked body LB, the lowermost conductive layer functions as a source-side selection gate line SGS, and the uppermost conductive layer functions as a drain-side selection gate line SGD. The selection gate line SGD is divided for each pillar P arranged along the X direction. A plurality of conductive layers sandwiched between the selection gate lines SGS and SGD functions as a plurality of word lines WL. The number of stacked word lines WL (number of memory cells MS) is optionally set in accordance with application and the like. Although an insulating layer is arranged between the selection gate lines SGS and SGD and the plurality of word lines WL, the description of the insulating layer is omitted in FIG. 2. Each pillar P is connected to a bit line BL on the stacked body LB. Each bit line BL is connected to a plurality of pillars P arranged along the Y direction.

The above-described configuration causes a memory cell MC to be arranged in a connection portion between each pillar P and each word line WL. The memory cell MC is arranged in a height direction of the pillar P. A source-side selection transistor STS and a drain-side selection transistor STD are arranged at connection portions between each pillar P and the selection gate lines SGS and SGD. A selection transistor STS, a plurality of memory cells MC, and a selection transistor STD, which are arranged in the height direction of one pillar P, constitute a memory string MS. The memory cell array 11 is configured in such a way. In the memory cell array 11, a plurality of memory cells MC is arranged three dimensionally (in matrix) inside the stacked body LB.

The plurality of word lines WL is drawn out to the outside of the memory cell array 11, and is connected to contacts in the descending stepped portion 12 and the ascending stepped portion 13 to be described later.

Figure 3:
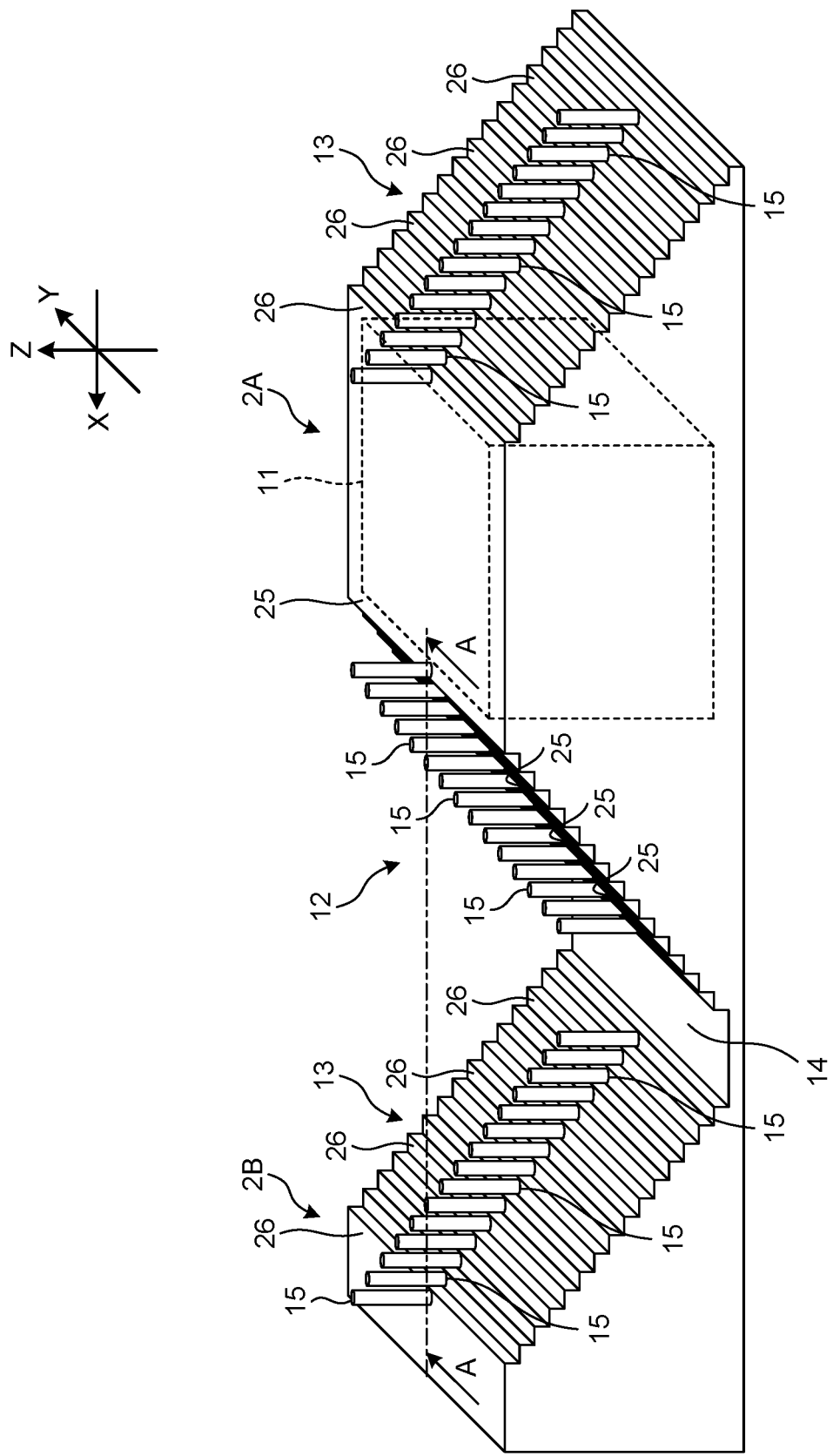
FIG. 3 is a perspective view illustrating one example of the structures of a descending stepped portion and an ascending stepped portion of the embodiment.

FIG. 3 is a perspective view illustrating one example of the structures of the descending stepped portion 12 and the ascending stepped portion 13 of the embodiment. FIG. 3 schematically illustrates a portion corresponding to a region 20 indicated by a one-dot chain line in FIG. 1, and schematically illustrates parts of two cells 2A and 2B (examples of first cell and second cell) adjacent along the X direction.

As illustrated in FIG. 3, the descending stepped portion 12 is provided on the left side (positive side in X direction) of the memory cell array 11, and the ascending stepped portion 13 is provided on the right side (negative side in X direction) of the memory cell array 11. The descending stepped portion 12 includes a plurality of terrace portions 25 stepped down in the X direction, and the ascending stepped portion 13 includes a plurality of terrace portions 26 stepped up in the X direction. A contact 15 is arranged on each terrace portion 25 and each terrace portion 26. The descending stepped portion 12 of one cell 2A and the ascending stepped portion 13 of the other cell 2B are arranged so as to face each other via the gap 14.

Figure 4:
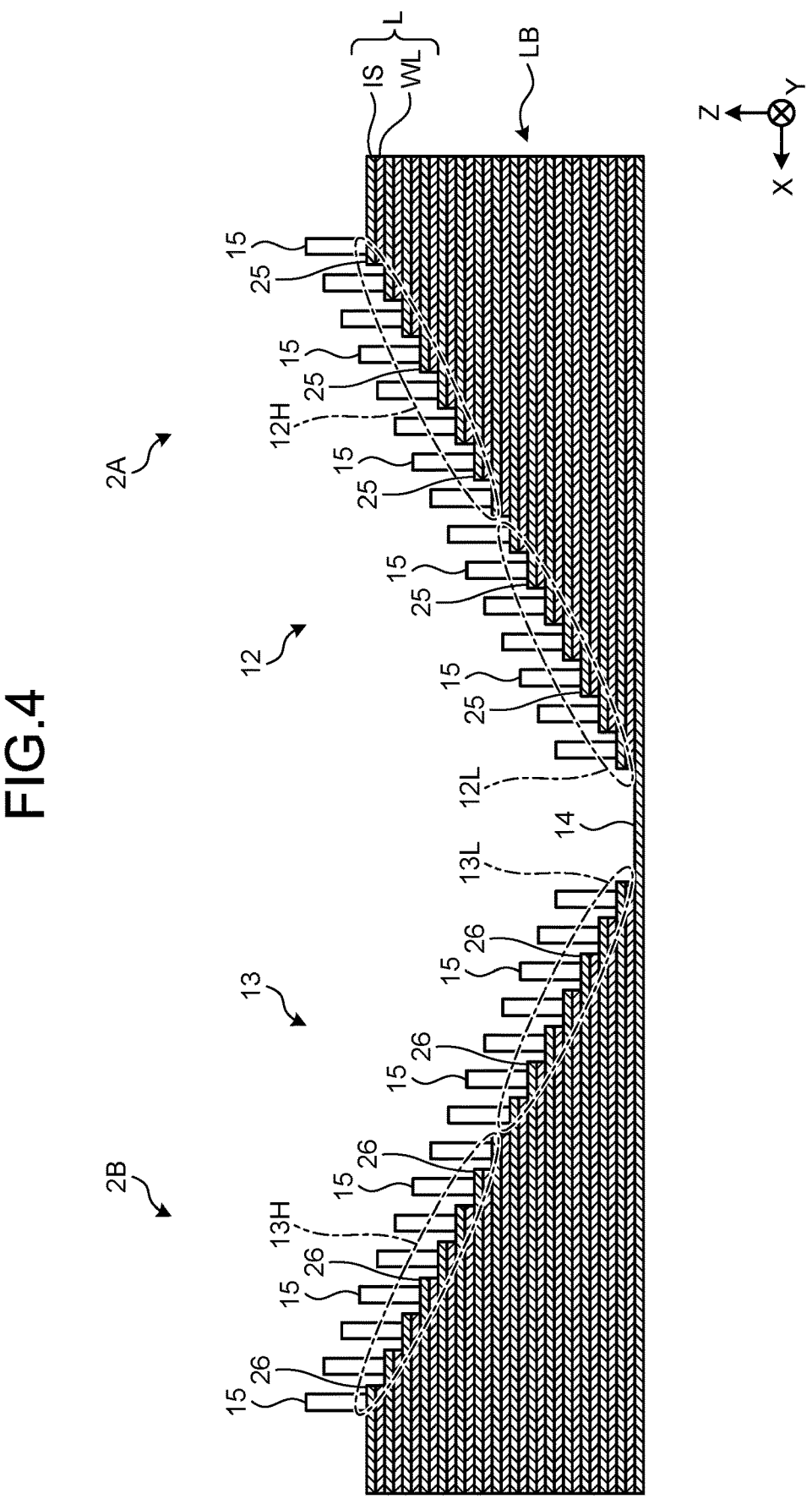
FIG. 4 is a cross-sectional view, taken along line A-A in FIG. 3, illustrating one example of the structures of the descending stepped portion and the ascending stepped portion facing each other in the embodiment.

FIG. 4 is a cross-sectional view, taken along line A-A in FIG. 3, illustrating one example of the structures of the descending stepped portion 12 and the ascending stepped portion 13 facing each other in the embodiment. As illustrated in FIG. 4, the stacked body LB constituting the descending stepped portion 12 and the ascending stepped portion 13 includes a plurality of stacked unit layers L each including a set of the word line WL and an insulating layer IS. Each terrace portion 25 of the descending stepped portion 12 and each terrace portion 26 of the ascending stepped portion 13 include an insulating layer IS. The contact 15 penetrates the insulating layer IS of the terrace portion 25 or 26, and is connected to the word line WL immediately under the insulating layer IS.

The descending stepped portion 12 of the embodiment is divided into a lower region 12L and an upper region 12H. In the embodiment, the entire descending stepped portion 12 includes the terrace portion 25 of fifteen steps. The lower region 12L includes the terrace portion 25 of seven steps. The upper region 12H includes the terrace portion 25 of eight steps. Similarly, the ascending stepped portion 13 of the embodiment is divided into a lower region 13L and an upper region 13H. In the embodiment, the entire ascending stepped portion 13 includes the terrace portion 26 of fifteen steps. The lower region 13L includes the terrace portion 26 of seven steps. The upper region 13H includes the terrace portion 26 of eight steps. Note that the number of steps of the terrace portion 25 of the entire descending stepped portion 12, the number of steps of the terrace portion 26 of the entire ascending stepped portion 13, the number of steps of the lower regions 12L and 13L, and the number of steps of the upper regions 12H and 13H are not limited to the above, and should be optionally set in accordance with application and the like.

The gap 14 includes the lowermost insulating layer IS of the stacked body LB. The gap 14 is formed between the descending stepped portion 12 and the ascending stepped portion 13 facing each other, that is, between the two cells 2A and 2B adjacent along the X direction. Since the contact 15 cannot be arranged in the gap 14, as much reduction of the gap 14 as possible is desired.

A method of manufacturing the semiconductor memory device 1 will be described below. In the manufacturing method of the embodiment, the descending stepped portion 12 of one cell 2A and the ascending stepped portion 13 of the other cell 2B are simultaneously formed by photolithography processing performed on the stacked body LB. The manufacturing method includes a method of reducing the above-described gap 14.

Figure 5:
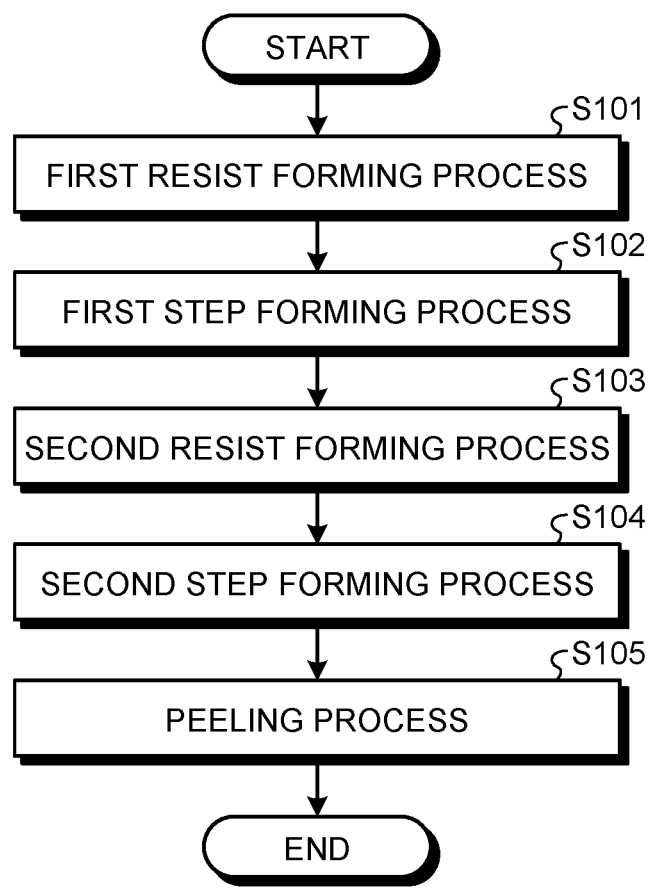
FIG. 5 is a flowchart illustrating one example of the flow of processes in a method of manufacturing the semiconductor memory device according to the embodiment.

FIG. 5 is a flowchart illustrating one example of the flow of processes in the method of manufacturing the semiconductor memory device 1 according to the embodiment. In the manufacturing method of the embodiment, first, the first resist forming process is performed (S101). In the first resist forming process, the first resist layer having the first opening pattern is formed on the upper surface of the stacked body LB.

Figure 6:
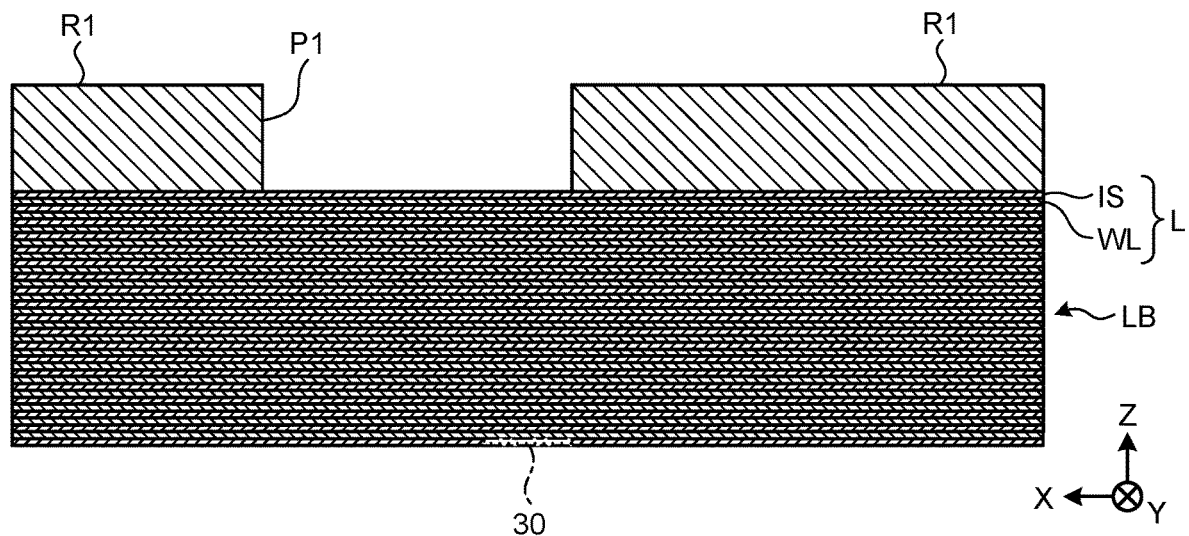
FIG. 6 is a cross-sectional view illustrating one example of the state of a stacked body in a first resist forming process of the embodiment.
Figure 7:
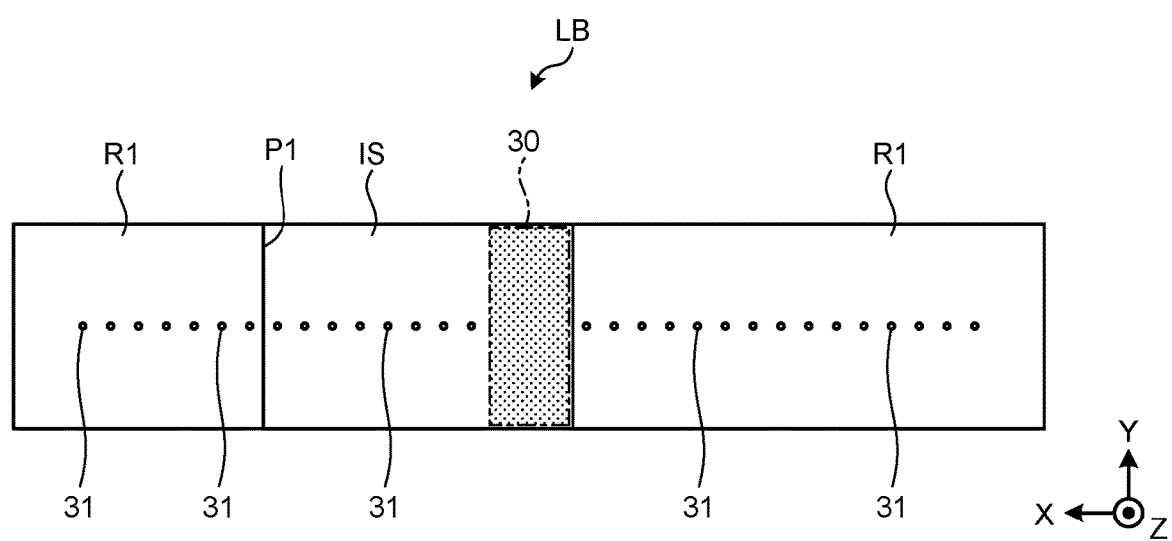
FIG. 7 is a top view illustrating one example of the state of the stacked body in the first resist forming process of the embodiment.

FIG. 6 is a cross-sectional view illustrating one example of the state of the stacked body LB in the first resist forming process of the embodiment. FIG. 7 is a top view illustrating one example of the state of the stacked body LB in the first resist forming process of the embodiment.

In the first resist forming process, as illustrated in FIGS. 6 and 7, a first resist layer R1 having a first opening pattern P1 is formed on the upper surface of the stacked body LB. The first opening pattern P1 exposes a part of the upper surface (uppermost insulating layer IS) of the stacked body LB. FIGS. 6 and 7 illustrate a gap formation region 30 indicating a region where the gap 14 is finally formed. The first opening pattern P1 is formed so as to have a width in the X direction larger than that of the gap formation region 30 in the X direction. The first opening pattern P1 of the embodiment is formed so as to include the gap formation region 30 and a part of a region (region on left side of gap formation region 30 in figure) where the ascending stepped portion 13 is finally formed. Furthermore, FIG. 7 illustrates a contact arrangement position 31 indicating a position where the contact 15 is finally arranged.

Then, as illustrated in FIG. 5, the first step forming process is performed (S102). In the first step forming process, the lower region 12L of the descending stepped portion 12 (one example of first stepped portion) of one cell 2A and the upper region 13H of the ascending stepped portion 13 (one example of second stepped portion) of the other cell 2B are simultaneously formed by etching processing performed via the first opening pattern P1.

Figure 8:
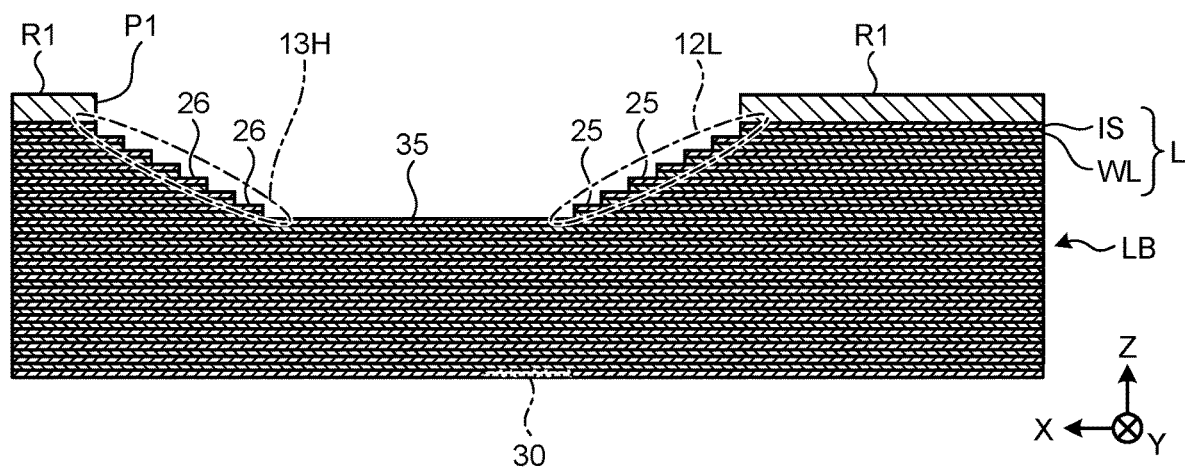
FIG. 8 is a cross-sectional view illustrating one example of the state of the stacked body in a first step forming process of the embodiment.
Figure 9:
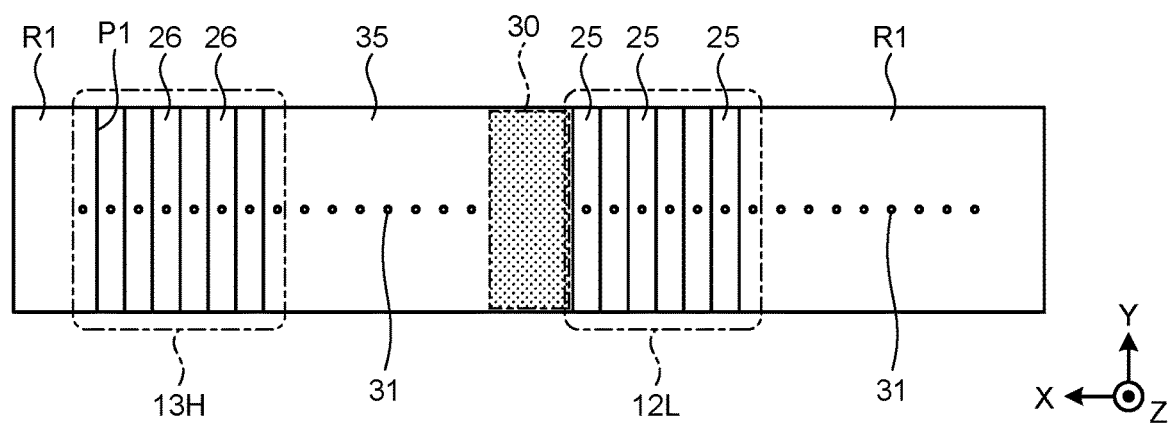
FIG. 9 is a top view illustrating one example of the state of the stacked body in the first step forming process of the embodiment.

FIG. 8 is a cross-sectional view illustrating one example of the state of the stacked body LB in the first step forming process of the embodiment. FIG. 9 is a top view illustrating one example of the state of the stacked body LB in the first step forming process of the embodiment.

For example, the first step forming process can be executed by repeating etching processing and ashing processing a predetermined number of times. In the etching processing, an exposed portion of the stacked body LB is etched via the first opening pattern P1. In the ashing processing, the first resist layer R1 is ashed so that the width of the first opening pattern P1 in the X direction is expanded. That is, first, the etching processing is performed via the first opening pattern P1 in the state as illustrated in FIGS. 6 and 7. Then, the width of the first opening pattern P1 in the X direction is expanded by the ashing processing by an amount corresponding to one step of the descending stepped portion 12 and the ascending stepped portion 13. Then, the etching processing is performed via the first opening pattern P1 expanded by the ashing processing. Such etching processing and ashing processing are repeated by the number of steps of the lower region 12L of the descending stepped portion 12 and the upper region 13H of the ascending stepped portion 13. As a result, the lower region 12L of the descending stepped portion 12 and the upper region 13H of the ascending stepped portion 13 are simultaneously formed in the stacked body LB. At the end of the first step forming process, as illustrated in FIGS. 8 and 9, the lower region 12L of the descending stepped portion 12 and the upper region 13H of the ascending stepped portion 13 are formed. At this time, the width of an intermediate bottom portion 35 in the X direction is substantially the same as the initial width of the first opening pattern P1 in FIGS. 6 and 7, and larger than the width of the gap formation region 30 in the X direction. The intermediate bottom portion 35 is formed between the lower region 12L of the descending stepped portion 12 and the upper region 13H of the ascending stepped portion 13.

Then, as illustrated in FIG. 5, the second resist forming process is performed (S103). In the second resist forming process, a second resist layer having the second opening pattern is formed on the upper surface of the stacked body LB.

Figure 10:
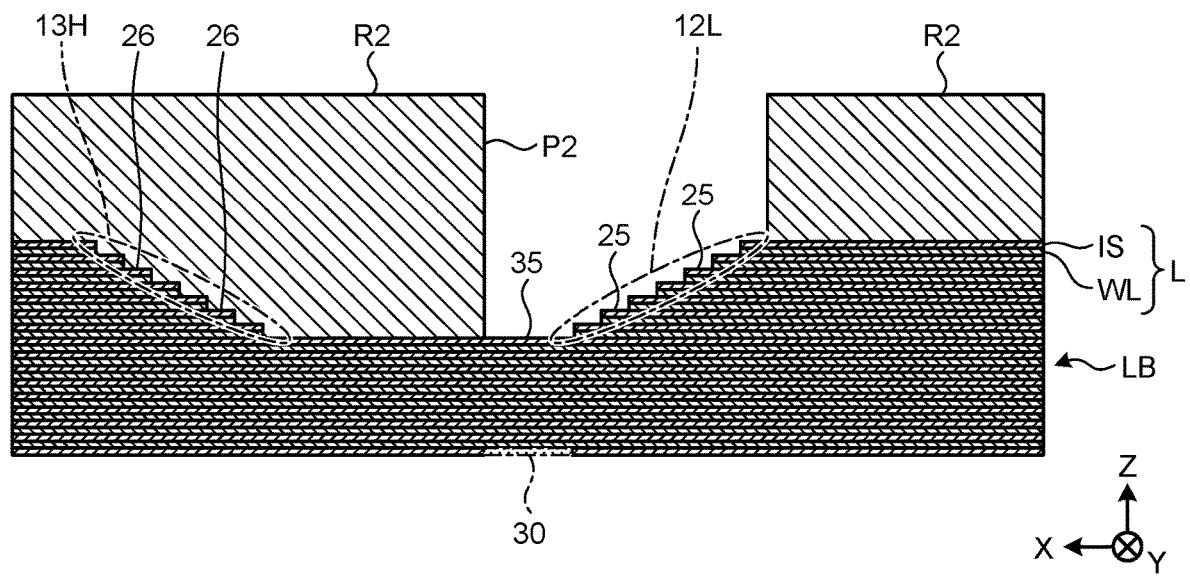
FIG. 10 is a cross-sectional view illustrating one example of the state of the stacked body in a second resist forming process of the embodiment.
Figure 11:
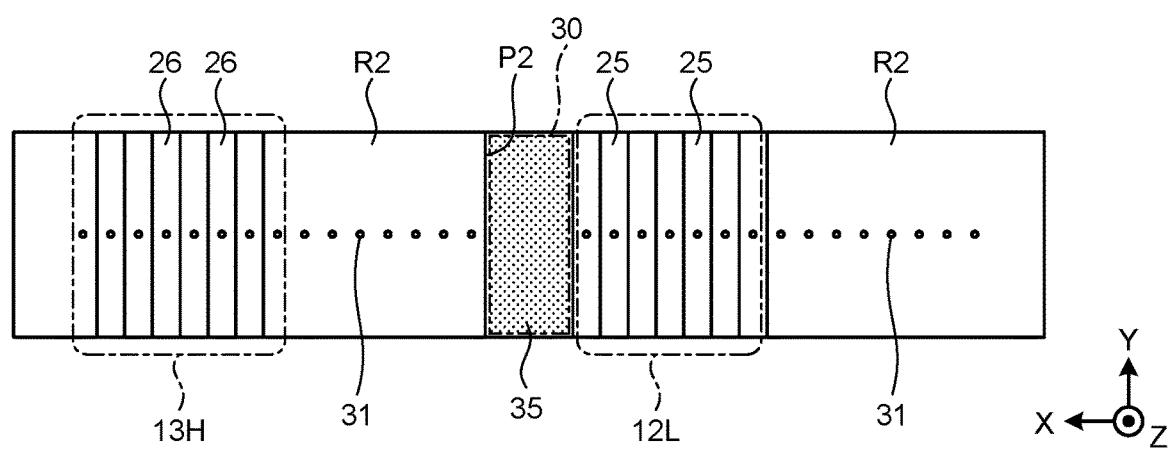
FIG. 11 is a top view illustrating one example of the state of the stacked body in the second resist forming process.

FIG. 10 is a cross-sectional view illustrating one example of the state of the stacked body LB in the second resist forming process of the embodiment. FIG. 11 is a top view illustrating one example of the state of the stacked body LB in the second resist forming process.

FIGS. 10 and 11 illustrate a state in which a second resist layer R2 having a second opening pattern P2 is formed on the upper surface of the stacked body LB. In this case, the second opening pattern P2 is formed so as to expose a part of the intermediate bottom portion 35 formed by the first step forming process and the lower region 12L of the descending stepped portion 12.

Then, as illustrated in FIG. 5, the second step forming process is performed (S104). In the second step forming process, the upper region 12H of the descending stepped portion 12 of one cell 2A and the lower region 13L of the ascending stepped portion 13 of the other cell 2B are simultaneously formed by etching processing performed via the second opening pattern P2.

Figure 12:
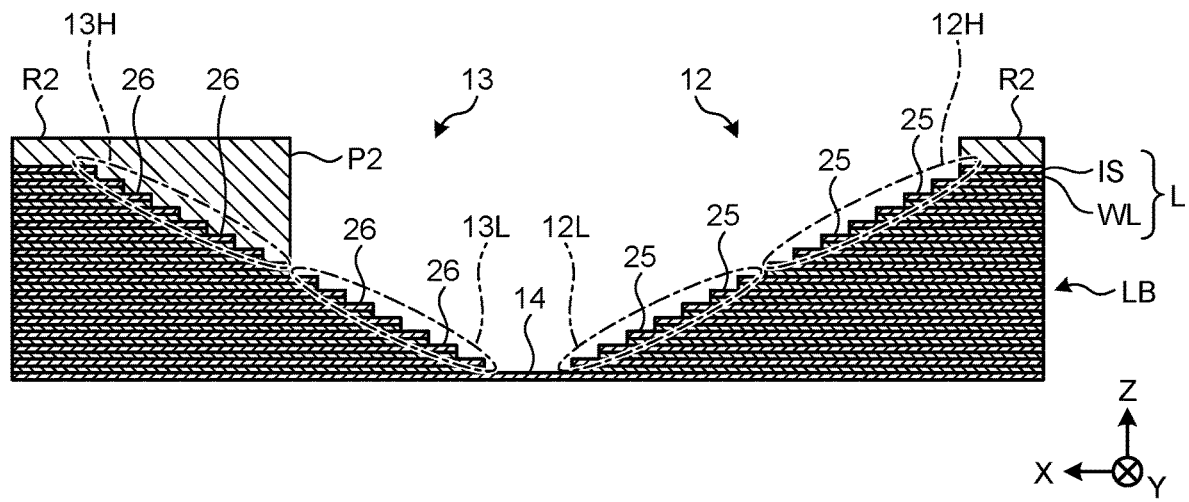
FIG. 12 is a cross-sectional view illustrating one example of the state of the stacked body in the second step forming process of the embodiment.
Figure 13:
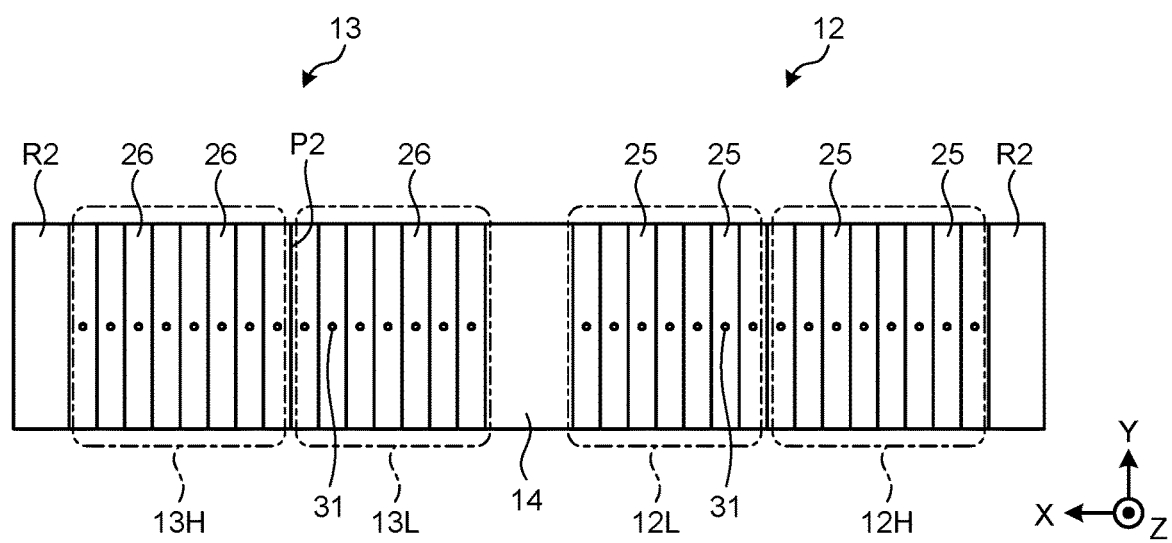
FIG. 13 is a top view illustrating one example of the state of the stacked body in the second step forming process of the embodiment.

FIG. 12 is a cross-sectional view illustrating one example of the state of the stacked body LB in the second step forming process of the embodiment. FIG. 13 is a top view illustrating one example of the state of the stacked body LB in the second step forming process of the embodiment.

For example, similarly to the first step forming process, the second step forming process can be executed by repeating etching processing and ashing processing a predetermined number of times. In the etching processing, an exposed portion of the stacked body LB is etched via the second opening pattern P2. In the ashing processing, the second resist layer R2 is ashed so that the width of the second opening pattern P2 in the X direction is expanded. That is, first, the etching processing is performed via the second opening pattern P2 in the state as illustrated in FIGS. 10 and 11. Then, the width of the second opening pattern P2 in the X direction is expanded by the ashing processing by an amount corresponding to one step of the descending stepped portion 12 and the ascending stepped portion 13. Then, the etching processing is performed via the second opening pattern P2 expanded by the ashing processing. Such etching processing and ashing processing are repeated by the number of steps of the upper region 12H of the descending stepped portion 12 and the lower region 13L of the ascending stepped portion 13. As a result, the upper region 12H of the descending stepped portion 12 and the lower region 13L of the ascending stepped portion 13 are simultaneously formed in the stacked body LB. At the end of the second step forming process, as illustrated in FIGS. 12 and 13, all steps of the descending stepped portion 12 and all steps of the ascending stepped portion 13 are formed. The second resist layer R2 remains on the upper region 13H of the ascending stepped portion 13. At this time, the width in the X direction of the gap 14 formed between the descending stepped portion 12 and the ascending stepped portion 13 is smaller than the initial width in the X direction of the first opening pattern P1 formed in the first resist layer R1 (see FIGS. 6 and 7) and the initial width in the X direction of the second opening pattern P2 formed in the second resist layer R2 (see FIGS. 10 and 11).

Then, as illustrated in FIG. 5, a peeling process is performed (S105). In the peeling process, the second resist layer R2 remaining on the stacked body LB is removed. This completes the formation of the descending stepped portion 12 and the ascending stepped portion 13 facing each other.

Then, predetermined processes such as installation of the contact 15 at the contact arrangement position 31 and formation of a wiring pattern of the substrate S are executed, and the semiconductor memory device 1 as illustrated in FIG. 1 is manufactured.

As described above, according to the embodiment, when the descending stepped portion 12 and the ascending stepped portion 13 facing each other are formed, the lower region 12L of the descending stepped portion 12 and the upper region 13H of the ascending stepped portion 13 are simultaneously formed first, and then the upper region 12H of the descending stepped portion 12 and the lower region 13L of the ascending stepped portion 13 are simultaneously formed. According to such a manufacturing method, as compared with a case where all the steps of the descending stepped portion 12 and all the steps of the ascending stepped portion 13 are simultaneously formed, the gap 14 finally formed between the descending stepped portion 12 and the ascending stepped portion 13 can be reduced, and the entire semiconductor memory device 1 can be downsized.

Furthermore, according to the manufacturing method of the embodiment, when each of the descending stepped portion 12 and the ascending stepped portion 13 has three or more steps, the width of the gap 14 in the X direction can be 1 µm or less.

Note that, although, in the above-described example, the lower region 12L of the descending stepped portion 12 and the upper region 13H of the ascending stepped portion 13 are formed first, and then the upper region 12H of the descending stepped portion 12 and the lower region 13L of the ascending stepped portion 13 are formed, the formation order may be reversed. That is, the upper region 12H of the descending stepped portion 12 and the lower region 13L of the ascending stepped portion 13 may be formed first, and then the lower region 12L of the descending stepped portion 12 and the upper region 13H of the ascending stepped portion 13 may be formed.

Figure 14:
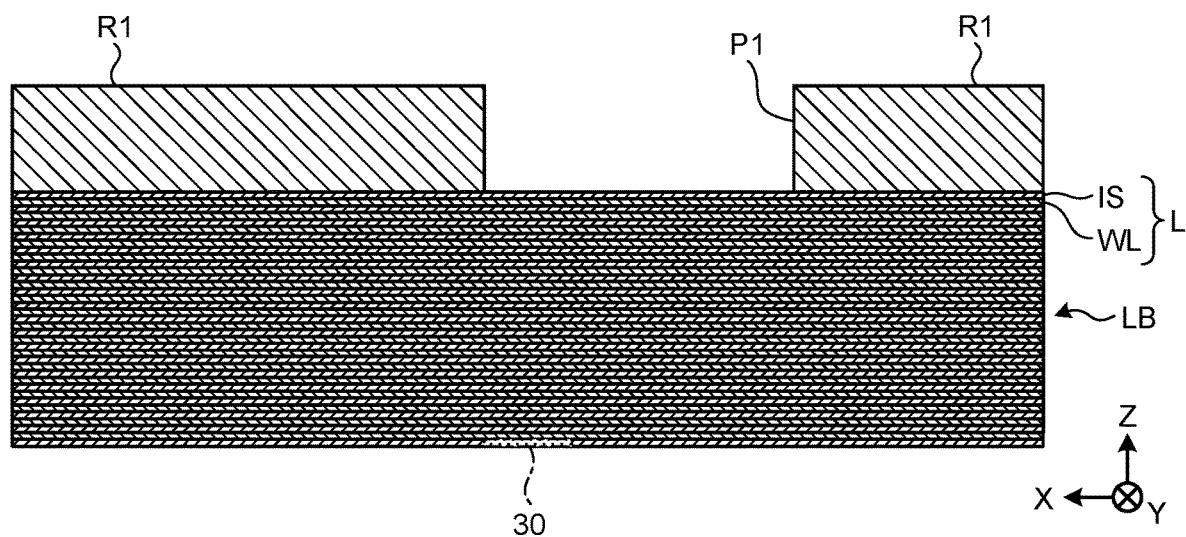
FIG. 14 is a cross-sectional view illustrating one example of the state of the stacked body in the first resist forming process of a variation.
Figure 15:
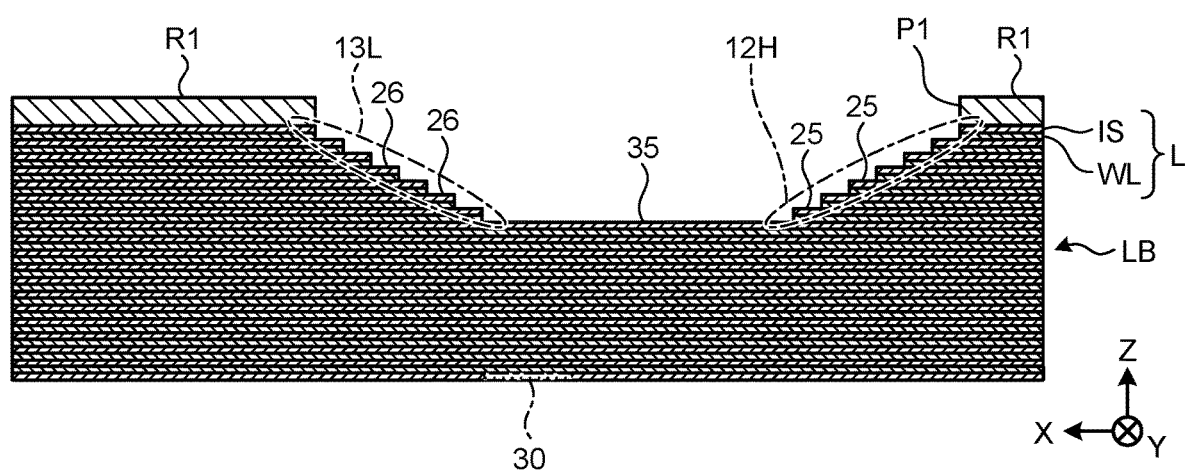
FIG. 15 is a cross-sectional view illustrating one example of the state of the stacked body in the first step forming process of the variation.
Figure 16:
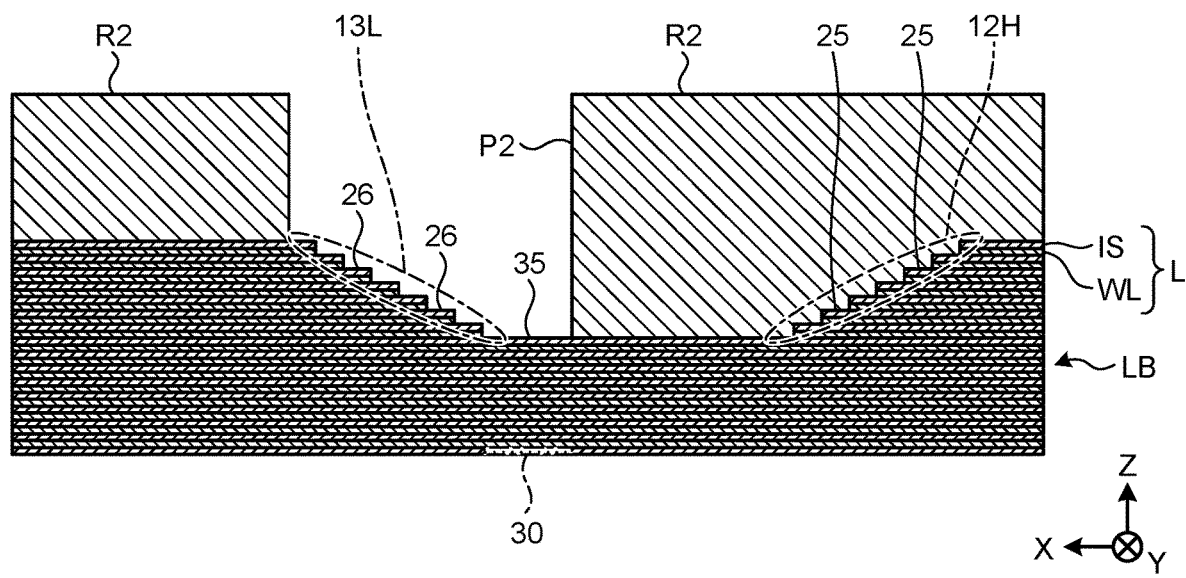
FIG. 16 is a cross-sectional view illustrating one example of the state of the stacked body in the second resist forming process of the variation.
Figure 17:
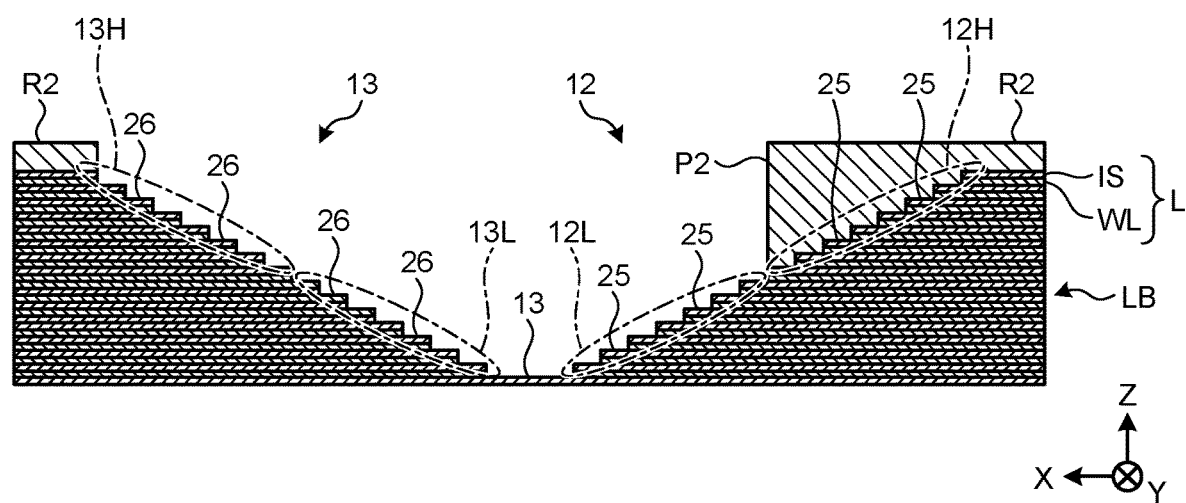
FIG. 17 is a cross-sectional view illustrating one example of the state of the stacked body in the second step forming process of the variation.

FIG. 14 is a cross-sectional view illustrating one example of the state of the stacked body LB in the first resist forming process of a variation. FIG. 15 is a cross-sectional view illustrating one example of the state of the stacked body LB in the first step forming process of the variation. FIG. 16 is a cross-sectional view illustrating one example of the state of the stacked body LB in the second resist forming process of the variation. FIG. 17 is a cross-sectional view illustrating one example of the state of the stacked body LB in the second step forming process of the variation.

In the variation, as illustrated in FIG. 14, the first opening pattern P1 of the first resist layer R1 is formed so as to include the gap formation region 30 and a part of a region (region on right side of gap formation region 30 in figure) where the descending stepped portion 12 is finally formed. Furthermore, as illustrated in FIG. 15, at the end of the first step forming process, the upper region 12H of the descending stepped portion 12 and the lower region 13L of the ascending stepped portion 13 are formed. Furthermore, as illustrated in FIG. 16, the second opening pattern P2 of the second resist layer R2 is formed so as to expose a part of the intermediate bottom portion 35 formed by the first step forming process and the lower region 13L of the ascending stepped portion 13. Furthermore, as illustrated in FIG. 17, at the end of the second step forming process, the second resist layer R2 remains on the upper region 12H of the descending stepped portion 12. Effects similar to those in the above-described embodiment can be obtained also by such a variation.

Furthermore, although, in the above description, a case where the descending stepped portion 12 and the ascending stepped portion 13 facing each other are electrically separated has been described, the relation between the descending stepped portion 12 and the ascending stepped portion 13 is not limited to that in this case. For example, the descending stepped portion and the ascending stepped portion facing each other may be electrically connected. The manufacturing method of the embodiment can be widely applied to the case of forming a descending stepped portion and an ascending stepped portion in a positional relation in which these portions face each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor memory device in which a descending stepped portion, an ascending stepped portion, a first cell, and a second cell are formed in a stacked body, a plurality of unit layers including a conductive layer and an insulating layer being stepped down in a first direction, the unit layers being stepped up in the first direction so as to face the descending stepped portion, the unit layers being stacked in the stacked body, the first cell and the second cell being disposed adjacently with the descending stepped portion and the ascending stepped portion in between, the first cell being connected to the descending stepped portion, the second cell being connected to the ascending stepped portion, the method comprising:

a first resist forming process of forming a first resist layer on an upper surface of the stacked body, the first resist layer having a first opening pattern that exposes a part of the upper surface of the stacked body;

a first step forming process of simultaneously forming a lower region of a first stepped portion, which is one of the descending stepped portion and the ascending stepped portion, and an upper region of a second stepped portion, which is another of the descending stepped portion and the ascending stepped portion, by etching processing performed via the first opening pattern without forming an upper portion of the first stepped portion simultaneously;

a second resist forming process of forming a second resist layer on the upper surface of the stacked body, the second resist layer having a second opening pattern that exposes a part of an intermediate bottom portion, which is a lowermost step of the first stepped portion and the second stepped portion formed by the first step forming process, and the lower region of the first stepped portion;

a second step forming process of simultaneously forming the upper region of the first stepped portion and a lower region of the second stepped portion to form a gap between the descending stepped portion and the ascending stepped portion by etching processing performed via the second opening pattern; and a process of arranging, on terrace portions of the descending stepped portion, contacts for extracting charge from the first cell, and arranging, on terrace portions of the ascending stepped portion, contacts for extracting charge from the second cell.

2. The method of manufacturing a semiconductor memory device, according to claim 1,
wherein a width of the first opening pattern in the first direction and a width of the second opening pattern in the first direction are larger than a width in the first direction of the gap, which is formed between the descending stepped portion and the ascending stepped portion after the second step forming process.

3. The method of manufacturing a semiconductor memory device, according to claim 2,
wherein the width in the first direction of the gap is 1 μm or less.

4. The method of manufacturing a semiconductor memory device, according to claim 1,
wherein a width of the intermediate bottom portion in the first direction is larger than a width in the first direction of the gap, which is formed between the descending stepped portion and the ascending stepped portion after the second step forming process.

5. The method of manufacturing a semiconductor memory device, according to claim 4,
wherein the width in the first direction of the gap is 1 μm or less.

6. The method of manufacturing a semiconductor memory device, according to claim 1,
wherein the descending stepped portion and the ascending stepped portion are electrically separated.

7. The method of manufacturing a semiconductor memory device, according to claim 1,
wherein the gap is formed by a lowermost insulating layer of the stacked body.

* * * * *